(12) United States Patent
Sudhakaran et al.

(10) Patent No.: US 12,470,216 B2
(45) Date of Patent: Nov. 11, 2025

(54) SYSTEM AND METHOD FOR CONFIGURING PROGRAMMABLE ANALOG BLOCK

(71) Applicant: Cypress Semiconductor Corporation, San Jose, CA (US)

(72) Inventors: Nidhin Mulangattil Sudhakaran, Lynnwood, WA (US); Bert Sullam, Bellevue, WA (US); Eashwar Thiagarajan, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 485 days.

(21) Appl. No.: 18/099,174

(22) Filed: Jan. 19, 2023

(65) Prior Publication Data
US 2024/0250684 A1    Jul. 25, 2024

(51) Int. Cl.
*H03K 19/0175* (2006.01)
*H03F 3/45* (2006.01)
*H03K 19/17736* (2020.01)

(52) U.S. Cl.
CPC .  *H03K 19/017581* (2013.01); *H03F 3/45668* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 8,547,135 B1 * | 10/2013 | Yarlagadda | H03K 19/177 326/38 |
| 8,717,070 B1 * | 5/2014 | Klein | H03F 3/45475 327/108 |
| 9,473,144 B1 * | 10/2016 | Thiagarajan | H03K 19/17712 |
| 2016/0065216 A1 * | 3/2016 | Thiagarajan | H03K 19/0005 326/38 |

* cited by examiner

*Primary Examiner* — Anh Q Tran

(57) ABSTRACT

One or more computing devices, systems, and/or methods are provided. In an example of the techniques presented herein, a system comprises a first input terminal and a first programmable analog block configured according to a first configuration. A controller is configured to reconfigure the first programmable analog block according to a second configuration different than the first configuration based on a first signal received at the first input terminal.

20 Claims, 9 Drawing Sheets

SYSTEM AND METHOD FOR CONFIGURING PROGRAMMABLE ANALOG BLOCK

BACKGROUND

Integrated circuit devices can include both digital and analog circuitry. Analog blocks of circuitry may be reconfigurable to meet demands for multitask processing and facilitate power management. Analog blocks can deliver functionality, such as measuring signal values and performing comparisons of measured quantities, which digital blocks of circuitry cannot readily provide.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, a system is provided. The system comprises a central processing unit, and a programmable analog sub-system connected to the central processing unit and comprising a first input terminal, a first programmable analog block configured according to a first configuration, and a controller configured to reconfigure the first programmable analog block according to a second configuration different than the first configuration based on a first signal received at the first input terminal independent from the central processing unit.

In an embodiment of the techniques presented herein, a programmable analog subsystem is provided. The programmable analog subsystem comprises a first operational amplifier, first routing circuitry configured to connect the first operational amplifier to a first input terminal in a first configuration and to connect the first operational amplifier to a second input terminal in a second configuration, second routing circuitry configured to connect one of a first reference signal or a second reference signal to the first operational amplifier in the first configuration or the second configuration, and a controller configured to receive an output signal of the first operational amplifier in the first configuration and reconfigure the first routing circuitry or the second routing circuitry based on the output signal.

In an embodiment of the techniques presented herein, a system comprises means for configuring a first programmable analog block according to a first configuration, means for configuring a second programmable analog block according to a second configuration, means for receiving a first input signal at the first programmable analog block, means for generating a first output signal based on the first input signal received at the first programmable analog block, and means for reconfiguring one of the first programmable analog block or the second programmable analog block according to a third configuration based on the first output signal without intervention from an external central processing unit.

In an embodiment of the techniques presented herein, a method comprises configuring a first programmable analog block according to a first configuration, configuring a second programmable analog block according to a second configuration, receiving a first input signal at the first programmable analog block, generating a first output signal based on the first input signal received at the first programmable analog block, and reconfiguring one of the first programmable analog block or the second programmable analog block according to a third configuration based on the first output signal without intervention from an external central processing unit.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
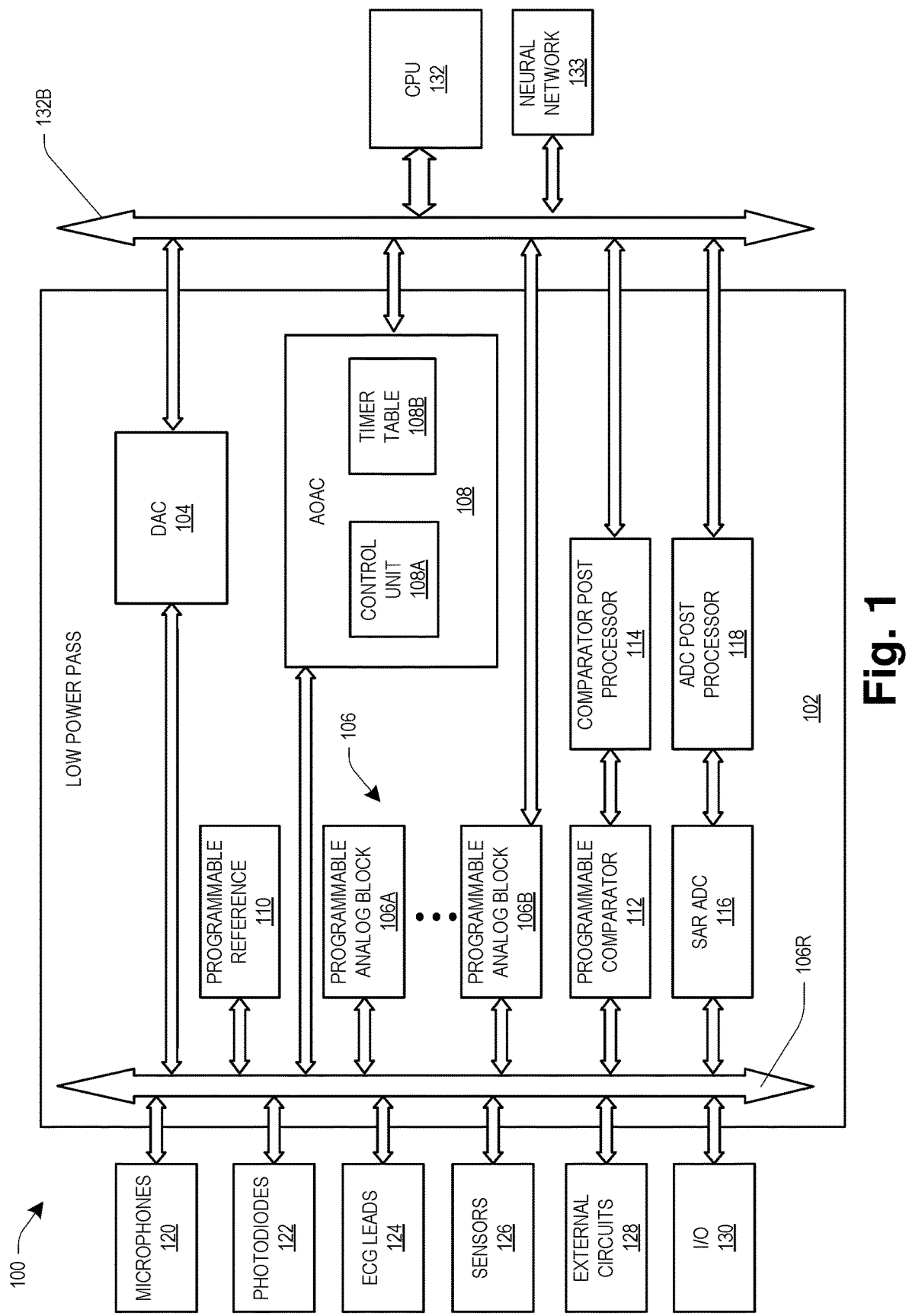
FIG. 1 is a diagram of a computing system, in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

Integrated circuits may include digital components, such as a central processing unit (CPU), and analog components, such as amplifiers. Analog components may be provided as reconfigurable analog blocks, that have configurable inputs, outputs, and resistor-capacitor (RC) circuits that may be configured to change the operating mode of the analog block to meet demands for multitask processing and facilitate power management. To improve power management performance, the analog blocks may be reconfigurable autonomously independent of the CPU, which may remain in a sleep mode or may perform a different operation. The CPU may be located in the same die/substrate as the analog circuits, or may be implemented separately.

Modern computing devices, especially automotive, wearable, hand-held, metering, appliance-integrated, and the like, require increasingly efficient power management. Many portable devices provide significant computational resources into small form factors. Compact dimensions may limit the capacity of portable devices for energy storage. Accordingly, managing energy consumption during execution of various tasks becomes increasingly important. Generally, executing a task faster using fewer components leads to better utilization of energy resources.

In some embodiments, programmable analog blocks may be combined into a programmable analog subsystem (PASS) that may be used in combination with or, in some implementations, separately from a CPU and a memory device. The CPU may have a variety of forms, such as a general purpose processor, an application processing unit (APU), a microcontroller unit (MCU), or some other processing resource programmable to perform specific operations. The CPU may be a separate circuit or a circuit embedded into a larger system. The PASS may comprise an autonomous controller independent of the CPU for decision-making regarding reconfiguring one or more analog blocks, programmable references and/or programmable comparators for use by the analog blocks, analog-to-digital converter (ADC) units, digital-to-analog converter (DAC) units, and/or post processing units. Based on a value of an input received by the PASS, the autonomous controller may reconfigure one or more of the programmable analog blocks to change the operating mode of the analog block. The PASS may perform such reconfiguration without waking up the CPU, if the CPU is in a sleep state, or without requesting a CPU interrupt, if the CPU is in an active state. Independent reconfiguration of the PASS may allow the CPU to perform other functions, such as processing of digital tasks that may be related or unrelated to the tasks that the PASS is performing. This arrangement may allow processing the same task faster if both the PASS and the CPU are processing different parts of the same task, or it may allow concurrent processing of different tasks by the LP PASS and the CPU.

In some embodiments, a programmable analog block comprises one or operational amplifiers. Routing circuitry, such as multiplexers, allow the inputs to the operation amplifier to be configured, and also allow different external circuits, such as resistor circuits, capacitor circuits, or RC circuits to be connected to input or output terminals of the operational amplifier. Example inputs include, optical sensors, such as photodiodes, sound sensors, such as microphones, electrical sensors, such as electrocardiogram (ECG) inputs, motion sensors, environmental sensors, chemical sensors, and/or inputs from other components, such as ADC units or DAC units. Routing circuitry also allows the output of an operation amplifier in the programmable analog block to be routed to different components, such as another programmable analog block, an ADC, an output terminal, a comparator, or some other destination.

FIG. 1 is a diagram of system 100 comprising a programmable analog subsystem (PASS) 102, in accordance with some embodiments. In some embodiments, the PASS 102 comprises a DAC 104, programmable analog blocks 106, an always-on autonomous controller (AOAC) 108, a programmable reference unit 110, a programmable comparator unit 112, a comparator post processor 114, a successive approximation register (SAR) ADC 116, and an ADC post processor 118. In some embodiments, the AOAC 108 comprises a control unit 108A and a timer table 108B. The timer table 108B stores configuration data for configuring the programmable analog blocks 106 into various operating modes. The control unit 108A, based on inputs to the PASS 102, selects configurations from the timer table 108B for dynamically configuring the programmable analog blocks 106. Routing circuitry 106R allows different input signals to be provided to the programmable analog blocks 106, the programmable comparator unit 112, and/or the SAR ADC 116. Responsive to the input signal, the AOAC 108 may reconfigure one or more of the programmable analog blocks 106 so that the analog circuits may provide functionality that is better adjusted to the changed conditions. In some embodiments, a look-up table is associated with the DAC 104 to allow generation of waveforms with predetermined shape and timing. The AOAC 108 may program the look-up table based on the operating mode. The ADC post processor 118 may include a first-in-first-out (FIFO) buffer for storing result data. The AOAC 108 may instruct the SAR ADC 116 to take samples until the FIFO is nearly full, before interrupting the CPU 122 to move the data. The number of programmable analog blocks 106 may vary, such as the two programmable analog blocks 106A, 106B. More than two programmable analog blocks 106 may be provided, but for the sake of clarity, only two are shown.

In some embodiments, the control unit 108A includes a finite state machine (FSM). The FSM may be hardware-implemented as a circuit (or a set of circuits) or the FSM may be implemented as instructions executed by the control unit 108A. The control unit 108A may receive an input from the SAR ADC 116 or the ADC post processor 118. Responsive to receiving an input, the FSM may be capable of selecting one or more FSM states that have corresponding settings in the timer table 108B for configuring the programmable analog blocks 106 and/or other elements of the PASS 102.

In some embodiments, the system 100 is embodied in a wearable device that measures a user's electrocardiogram using ECG sensors and/or heart rate variability using a photoplethysmography (PPG) sensor. The system 100 may also support voice communication with the user using voice detection and speech recognition. Example input sources include one or more microphones 120 for receiving audio signals to support voice processing, one or more photodiodes 122 for receiving optical signals to support heart rate determination, ECG leads 124 for receiving electrocardiogram signals, one or more sensors 126 for receiving other signals, such as temperature, motion, chemical sensing signals, or some other sensed signal, external circuits 128 for connecting to inputs/or outputs of the programmable analog blocks 106, and/or input/output (I/O) devices 130 for receiving user input or providing user output. The PASS 102 may include fewer components, additional components, different components, and/or a different arrangement of components than those illustrated in FIG. 1. The PASS 102 may interface with a CPU 132 over a CPU bus 132B. In some embodiments, the CPU 132 may execute a neural network 133, for example, using a separate processing core. The CPU 132 may receive outputs from the DAC 104, the programmable analog blocks 106, the AOAC 108, the comparator post processor 114, and/or the ADC post processor 118. The comparator post processor 114 and the ADC post processor 118 may be considered data processing units. In comparison to the CPU 132, the data processing units are low power computing units. In some embodiments, the PASS 102 and the CPU 132 may be provided on a single semiconductor die. The AOAC 108 operates independently and without intervention from the CPU 132 to reconfigure the programmable analog blocks 106.

Different configurations of the PASS 102 may have different routing fabrics defined by the routing circuitry 106R. For example, in some configurations intended for rough speech detection, a sound input signal from a microphone 120 may be delivered directly to the SAR ADC 116 by the routing circuitry 106R. In other configurations, such as when more accurate speech recognition is intended, the sound input from the microphone 120 may be first routed to one of the a programmable analog blocks 106 for enhanced processing. For example, the neural network unit 133 may be configured to perform enhanced speech detection. If the neural network unit 133 confirms the presence of a speech signal, the programmable analog blocks 106 may be configured by the AOAC 108 for enhanced speech data collection. In some embodiments, a programmable analog block 106 currently configured to support heart rate variability monitoring using a photodiode 122 may be reconfigured in response to a rough speech detection signal to support enhanced audio processing using a microphone 120. The enhanced speech data may be provided to the CPU 132 for full speech analysis. If the CPU 132 had previously been in a sleep state, the CPU 132 would be woken up to perform the speech analysis.

Figure 2:
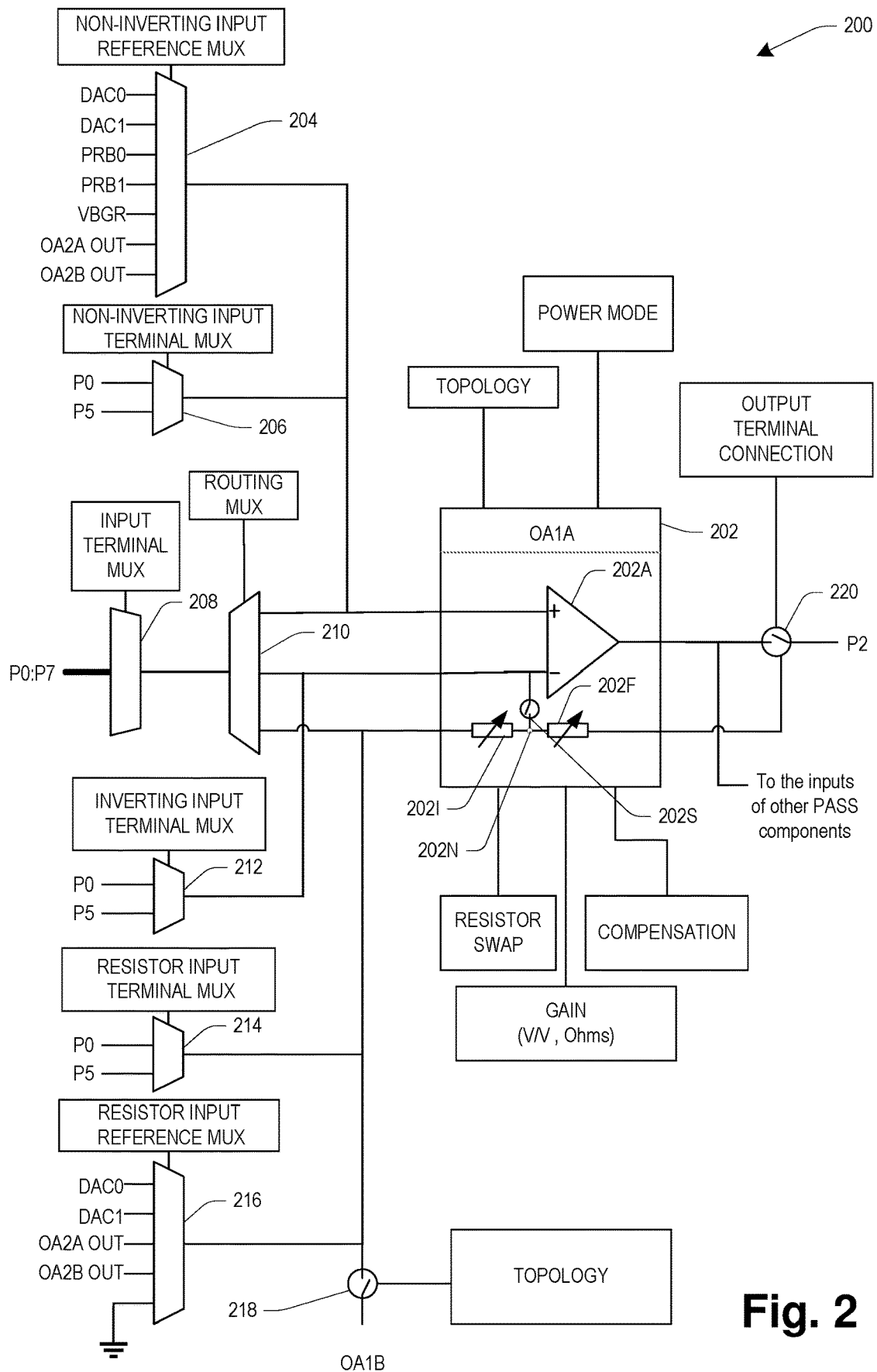
FIG. 2 is a diagram of a programmable analog block, in accordance with some embodiments.

FIG. 2 is a diagram of a programmable analog block 200, such as one of the programmable analog blocks 106, in accordance with some embodiments. The programmable analog block 200 comprises a first operational amplifier 202 (OA1A), a non-inverting reference terminal multiplexer 204, a non-inverting input terminal multiplexer 206, an input terminal multiplexer 208, a routing multiplexer 210, an inverting input terminal multiplexer 212, a resistor input terminal multiplexer 214, a resistor input reference multiplexer 216. The programmable analog block 200 also includes a second operational amplifier (OA1B) and a duplicate arrangement of multiplexers 204, 206, 208, 210, 212, 214, 216 connected to the first operational amplifier 202 by a switch 218. A switch 220 connects an output terminal of the operational amplifier 202 to a terminal of the PASS 102 (P2).

In some embodiments, the first operational amplifier 202 comprises a non-inverting terminal ("+"), an inverting terminal ("−"), a programmable input resistor 202I connected to a programmable feedback resistor 202F at a node 202N, and a switch 202S connected to the node 202N. The programmable input resistor 202I and the programmable feedback resistor 202F may be configured to have the same resistances or different resistances to affect the gain, to exhibit a short circuit, or to exhibit an open circuit. The programmable input resistor 202I, the programmable feedback resistor 202F, and the switch 202S may be configured based on the topology or operating mode of the operational amplifier 202. The terminals connected to the programmable input resistor 202I and the programmable feedback resistor 202F may be swapped to change the gain from a positive gain to a negative gain. The configuration of the operational amplifier 202 is represented by configuration blocks that specify topology, power mode, resistor swap, gain, and compensation. Compensation options include unity gain compensated, uncompensated for applications such as TIA, low power audio amplifiers, etc., custom gain-based frequency compensation for PGA, differential amplifier, etc.

The non-inverting reference terminal multiplexer 204 provides a selected reference signal, such as a DAC0 signal or a DAC1 signal generated by the DAC 104, a programmable reference signal, PRB0, PRB1, generated by the programmable reference unit 110, a band gap reference voltage, VBGR, or a reference generated by outputs of a different programmable analog block 200 (designated as OA2A output or OA2B output). The resistor input reference multiplexer 216 provides the same reference inputs to the input of the programmable input resistor 202I. The non-inverting input terminal multiplexer 206, the inverting input terminal multiplexer 212, and the resistor input terminal multiplexer 214 connects selected terminals (P0, P5) of the PASS 102 to the non-inverting terminal of the first operational amplifier 202, the inverting terminal of the first operational amplifier 202, and the input of the programmable input resistor 202I, respectively. The input terminal multiplexer 208 connects a selected terminal of the PASS 102 (p0:p7) to the routing multiplexer 210. The routing multiplexer 210 connects the input terminal multiplexer 208 to a selected one of the non-inverting terminal of the first operational amplifier 202, the inverting terminal of the first operational amplifier 202, or the input of the programmable input resistor 202I.

The programmable analog block 200 may be configured to support different topologies for the operational amplifier 202. In some applications, the operational amplifiers 202 (OA1A and OA1B) operate independently and may have different configured topologies. In a programmable gain amplifier (PGA) topology, the switch 218 is open to disconnect the second operational amplifier, OA1B, and the resistances of the programmable input resistor 202I and the programmable feedback resistor 202F determine the gain. In a transimpedance amplifier (TIA) topology, the programmable input resistor 202I is shorted and the programmable feedback resistor 202F determines the gain. In a buffer topology, both the programmable input resistor 202I and the programmable feedback resistor 202F are shorted. In an open loop topology, a comparator topology, or a hysteretic comparator topology, the switch 202S is open, disconnecting the resistors 202I, 202F. In some topologies the operational amplifiers 202 (OA1A and OA1B) are paired. For example, in a differential buffer topology, the switch 218 is closed, connecting the input resistor 202I of the OA1A operational amplifier 202 in series with the corresponding input resistor of the OA1B operational amplifier.

Figure 3A:
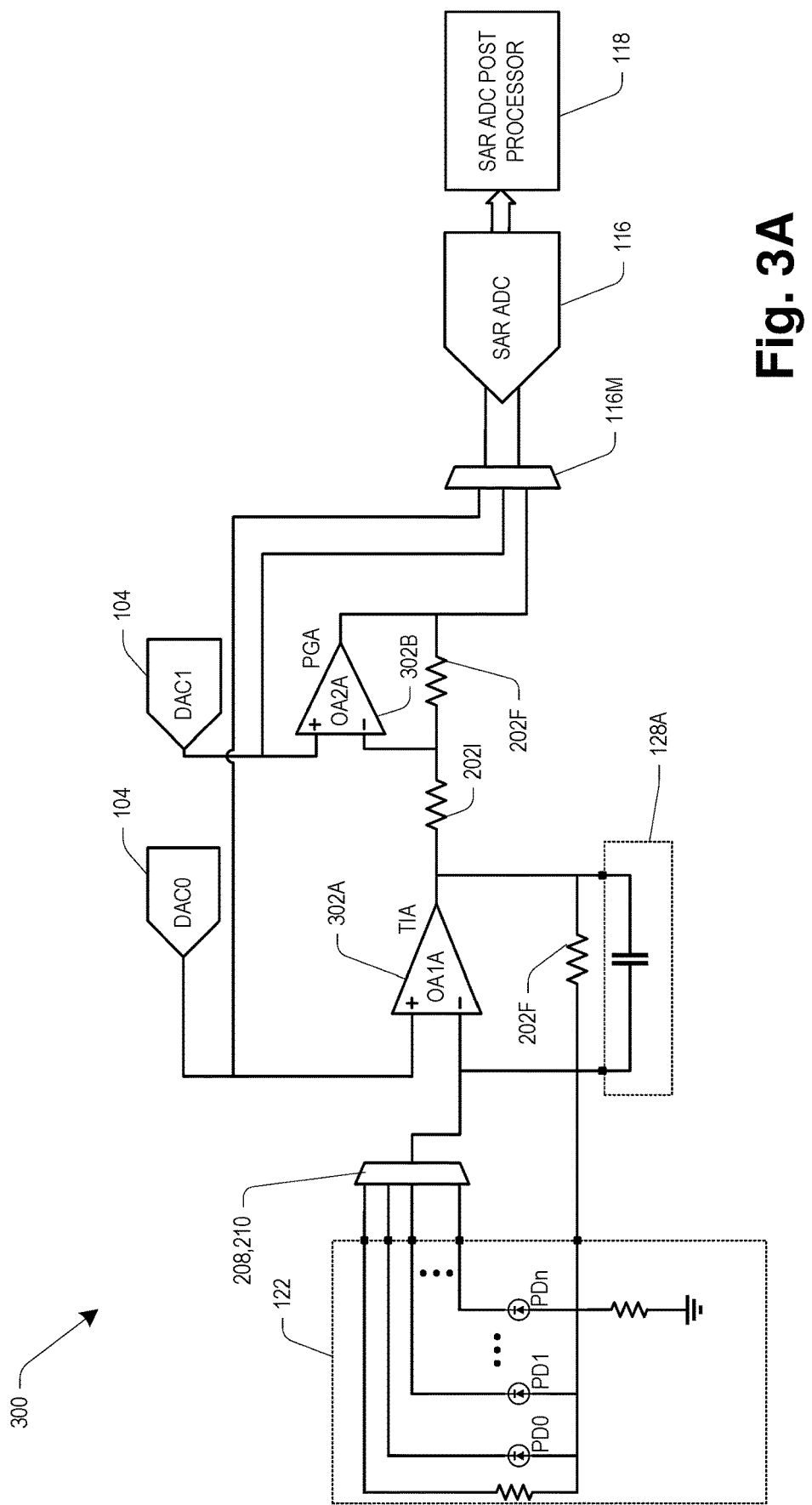
FIGS. 3A and 3B are diagrams of programmable analog blocks in a circuit, in accordance with some embodiments.
Figure 3B:
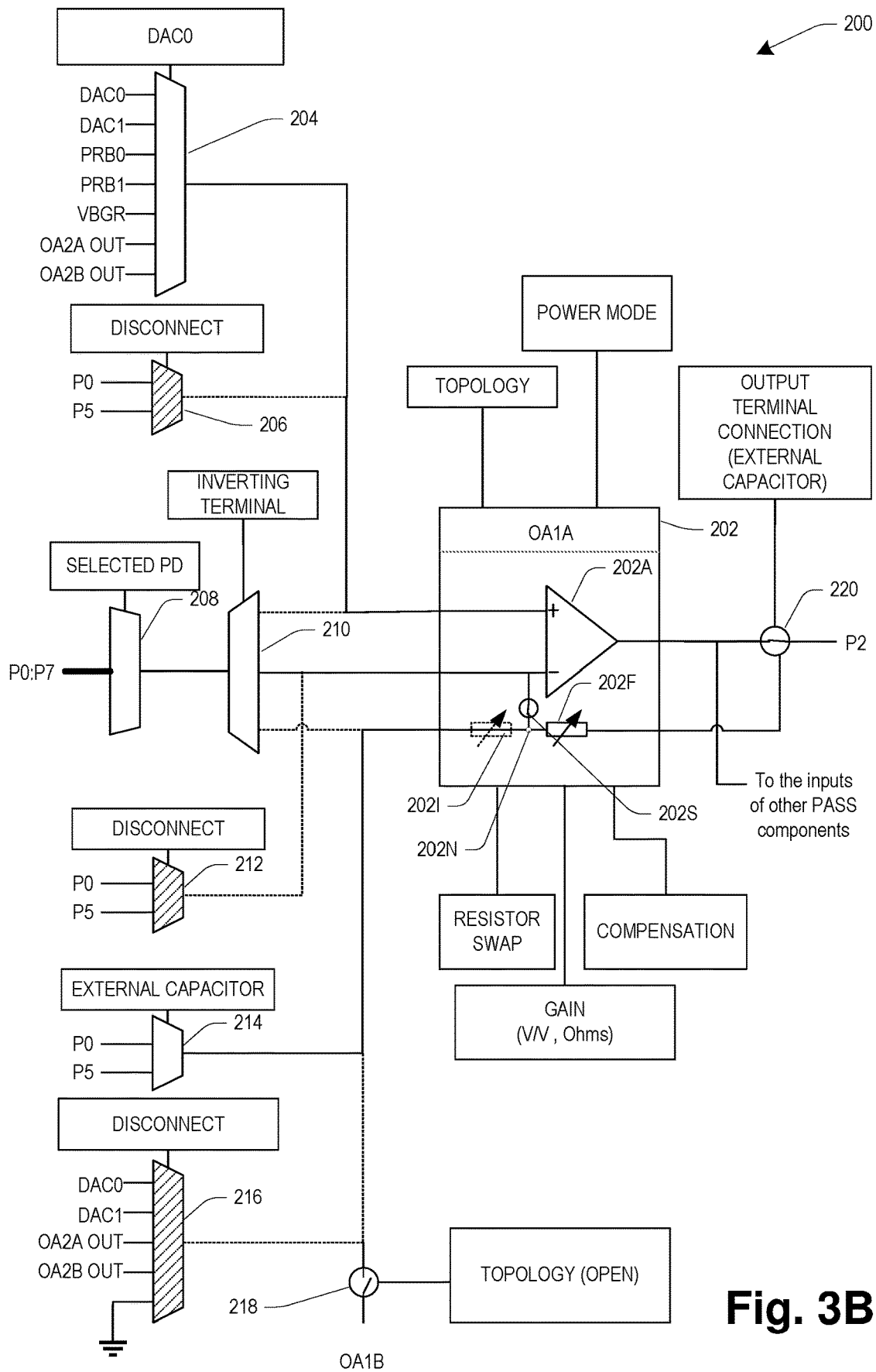

FIGS. 3A and 3B are diagrams of the programmable analog blocks 106 in a circuit 300 configured to function in a PPG mode to monitor heart rate variability, in accordance with some embodiments. The circuit 300 employs an OA1A operational amplifier 302A from the first programmable analog block 106A and an OA2A operational amplifier 302B from the second programmable analog block 106B. FIG. 3B illustrates the configuration of the OA1A operational amplifier 302A. The OA1A operational amplifier 302A is configured in a TIA topology. The non-inverting reference terminal multiplexer 204 is configured to select the DAC0 reference of the DAC 104 for the OA1A operational amplifier 302A. The non-inverting input terminal multiplexer 206 is disconnected. The input terminal multiplexer 208 and the routing multiplexer 210 (illustrated as a single multiplexer) connect a selected photodiode 122 to the inverting terminal of the OA1A operational amplifier 302A. The inverting input terminal multiplexer 212 and the resistor input reference multiplexer 216 are disconnected. The resistor input terminal multiplexer 214 and the switch 220 are configured to connect an external circuit 128A, such as a capacitor, in parallel with the programmable feedback resistor 202F.

The OA2A operational amplifier 302B in the programmable analog block 106B is configured in a PGA topology. The non-inverting reference terminal multiplexer 204 is configured to select the DAC1 reference of the DAC 104 for the OA2A operational amplifier 302B. The non-inverting input terminal multiplexer 206 is disconnected. The input terminal multiplexer 208 and the routing multiplexer 210 are disconnected. The inverting input terminal multiplexer 212 and the resistor input terminal multiplexer 214 are disconnected. The resistor input reference multiplexer 216 is configured to select the output of the OA2A operational amplifier 302B are disconnected.

A multiplexer 116M associated with the SAR DAC 116 is configured to select the DAC0 and DAC1 reference signals and the output of the OA2A operational amplifier 302B. The SAR ADC 116 and the ADC post processor 118 perform a heart rate variability analysis based on the optical input signals.

In one example, the OA1B operational amplifier 202 is configured for a different purpose than the OA1A operational amplifier 302A and the OA2A operational amplifier 302B. For example, the OA1A operational amplifier 302A and the OA2A operational amplifier 302B may be configured for heart rate variability analysis as shown in FIGS. 3A and 3B, and the OA1B operational amplifier 202 may be configured as a voice detection channel. Assuming a voice detection condition is met, and additional enhanced speech processing channel is desired, the heart rate variability analysis may be stopped and the OA1A operational amplifier 202 may be reconfigured to process voice signals.

Figure 4A:
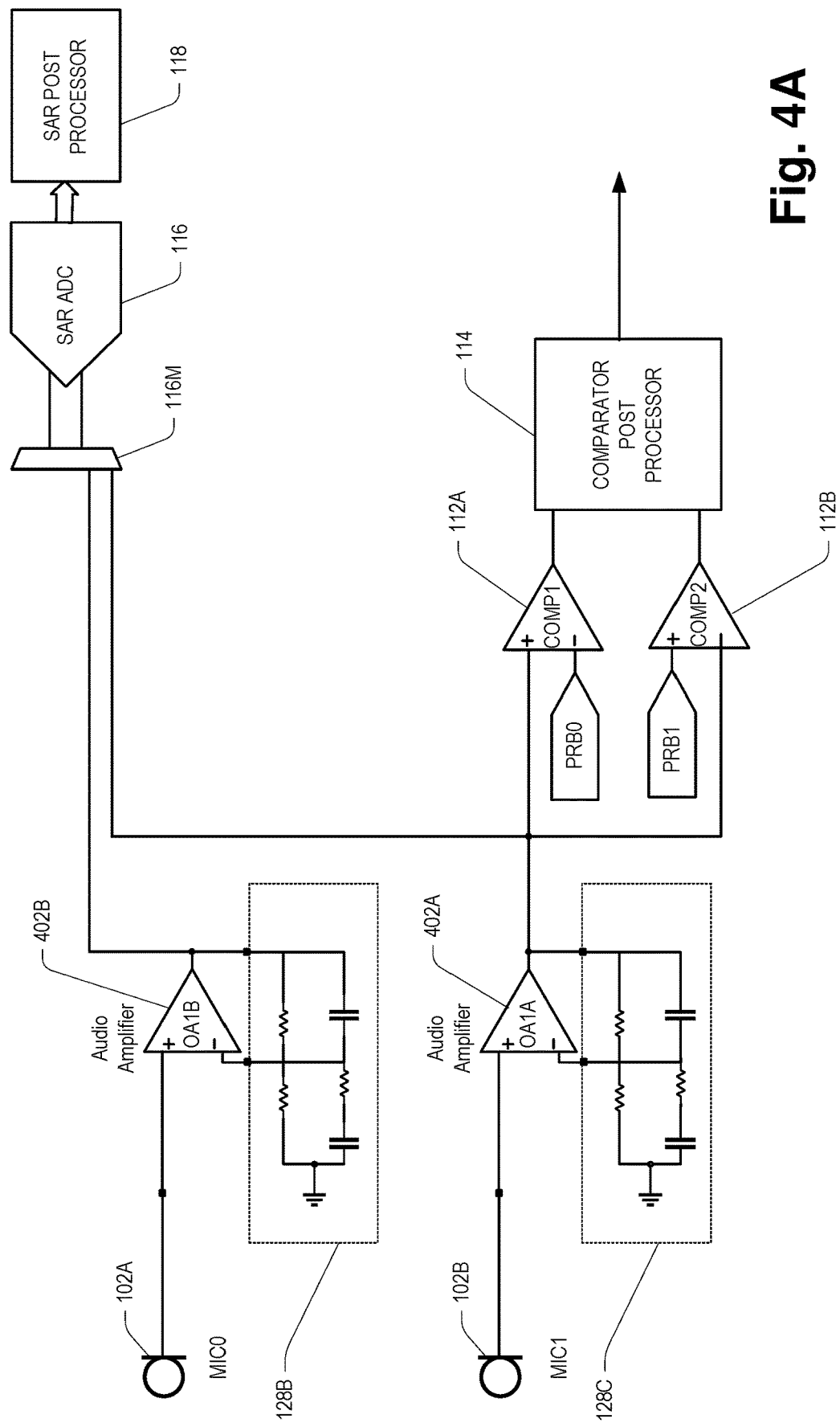
FIGS. 4A and 4B are diagrams of programmable analog blocks in a circuit, in accordance with some embodiments.
Figure 4B:
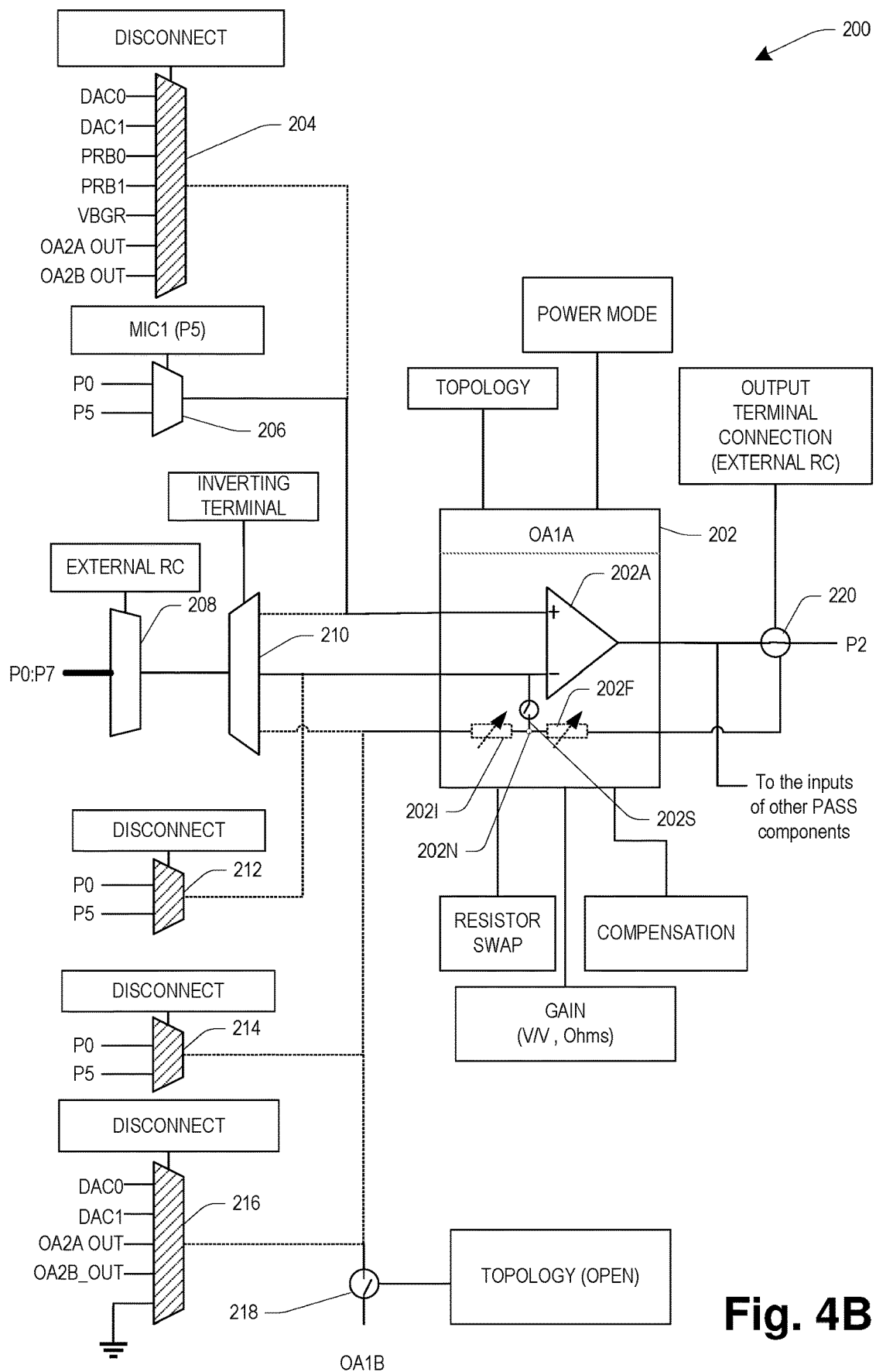

FIGS. 4A and 4B are diagrams of the programmable analog block 106A in a circuit 400 configured to function in an amplifier mode to monitor voice signals, in accordance with some embodiments. The circuit 400 employs an OA1A operational amplifier 402A and an OA1B operational amplifier 402B from the first programmable analog block 106A. In comparison to FIG. 3A, the OA1A operational amplifier 302A is reconfigured as an audio amplifier. The control unit 108A reconfigures the programmable analog blocks 106A by selecting a different configuration in the timer table 108B. Referring to FIGS. 4A and 4B, the OA1A operational amplifier 402A is configured in an amplifier topology. The non-inverting reference terminal multiplexer 204 is disconnected. The non-inverting input terminal multiplexer 206 is configured to select the MIC1 microphone 102B. The input terminal multiplexer 208, the routing multiplexer 210, and the switch 220 are configured to connect an external circuit 128C across the inverting terminal and the output terminal of the OA1A operational amplifier 402A. The inverting input terminal multiplexer 212, the resistor input reference multiplexer 216, and the resistor input terminal multiplexer 214 are disconnected. The switch 202S is open. The output of the OA1A operational amplifier 402A is connected to the SAR multiplexer 116M, the non-inverting terminal of a comparator 112A in the programmable comparator unit 112, and the inverting terminal of a comparator 112B in the programmable comparator unit 112. A PRB0 reference is provided by the programmable reference unit 110 to the inverting terminal of the comparator 112A, and a PRB1 reference is provided by the programmable reference unit 110 to the non-inverting terminal of the comparator 112B. The comparator post processor 114 receives the outputs of the comparators 112A, 112B. The OA1B operational amplifier 402B is configured in a similar manner to the OA1A operational amplifier 402A to connect to a microphone 102A, and to provide an external circuit 128B across the OA1B operational amplifier 402B, where the output of the OA1B operational amplifier 402B is routed to the SAR multiplexer 116M.

Figure 5:
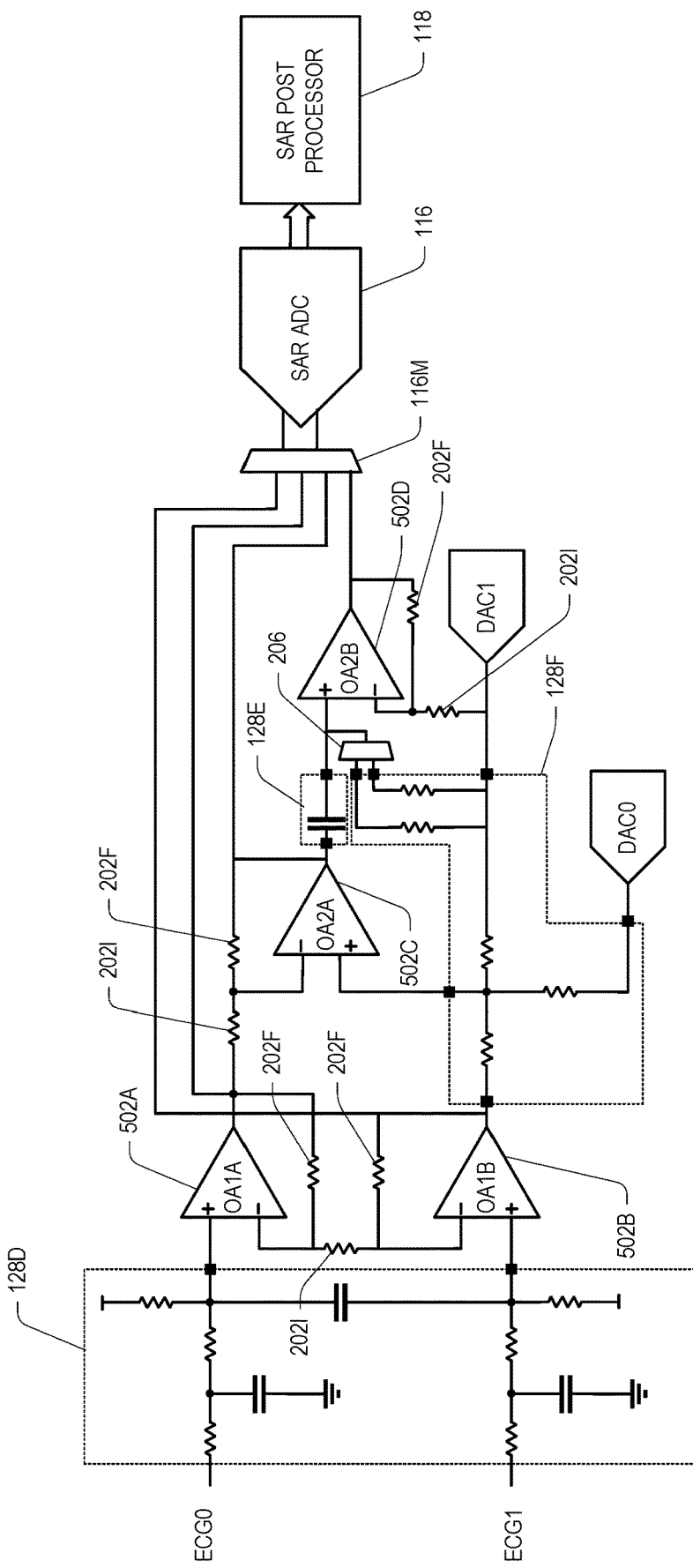
FIG. 5 is a diagram of programmable analog blocks in a circuit, in accordance with some embodiments.

FIG. 5 is a diagram of programmable analog blocks 106 in a circuit 500 for performing ECG analysis, in accordance with some embodiments. The OA1A operational amplifier 502A and the OA1B operational amplifier 502B are paired in a differential topology with the switch 218 closed. An external circuit 128D is connected across the non-inverting terminal of the OA1A operational amplifier 502A and the non-inverting terminal of the OA1B operational amplifier 502B by the respective non-inverting input terminal multiplexers 206 and the input terminal multiplexers 208. The OA2A amplifier 502C is configured in a PGA topology with the output of the OA1A operational amplifier 502A connected by the resistor input reference multiplexer 216 of the OA2A amplifier 502C. The output of the OA2A operational amplifier 502C is connected by an external circuit 128E to the input of the OA2B operational amplifier 502D using the switch 220 of the OA2A operational amplifier 502C and the non-inverting reference terminal multiplexer 204 of the OA2B operational amplifier 502D. The DAC1 reference is provided by the resistor input reference multiplexer 216 to the programmable input resistor 202I of the OA2B operational amplifier 502D. An external circuit 128F is connected to the non-inverting terminal of the OA2B operational amplifier 502D by the non-inverting input terminal multiplexer 206 and to the output of the QA1B operational amplifier 502B by the switch 220 of the QA1B operational amplifier 502B. The DAC0 reference is connected to the non-inverting terminal of the QA2A operational amplifier 502C by the non-inverting reference terminal multiplexer 204.

In an embodiment where the PASS 102 includes two programmable analog blocks 106, the configuration in the timer table 108B to support ECG functionality shown in FIG. 5 uses both programmable analog blocks 106 so heart rate variability or voice analysis is not available during ECG measurement activities. The programmable analog blocks 106 may be reconfigured by the control unit 108A by selecting a different configuration in the timer table 108B to support heart rate variability monitoring and/or voice analysis as described in reference to FIGS. 3A, 3B, 4A, and 4B.

Figure 6:
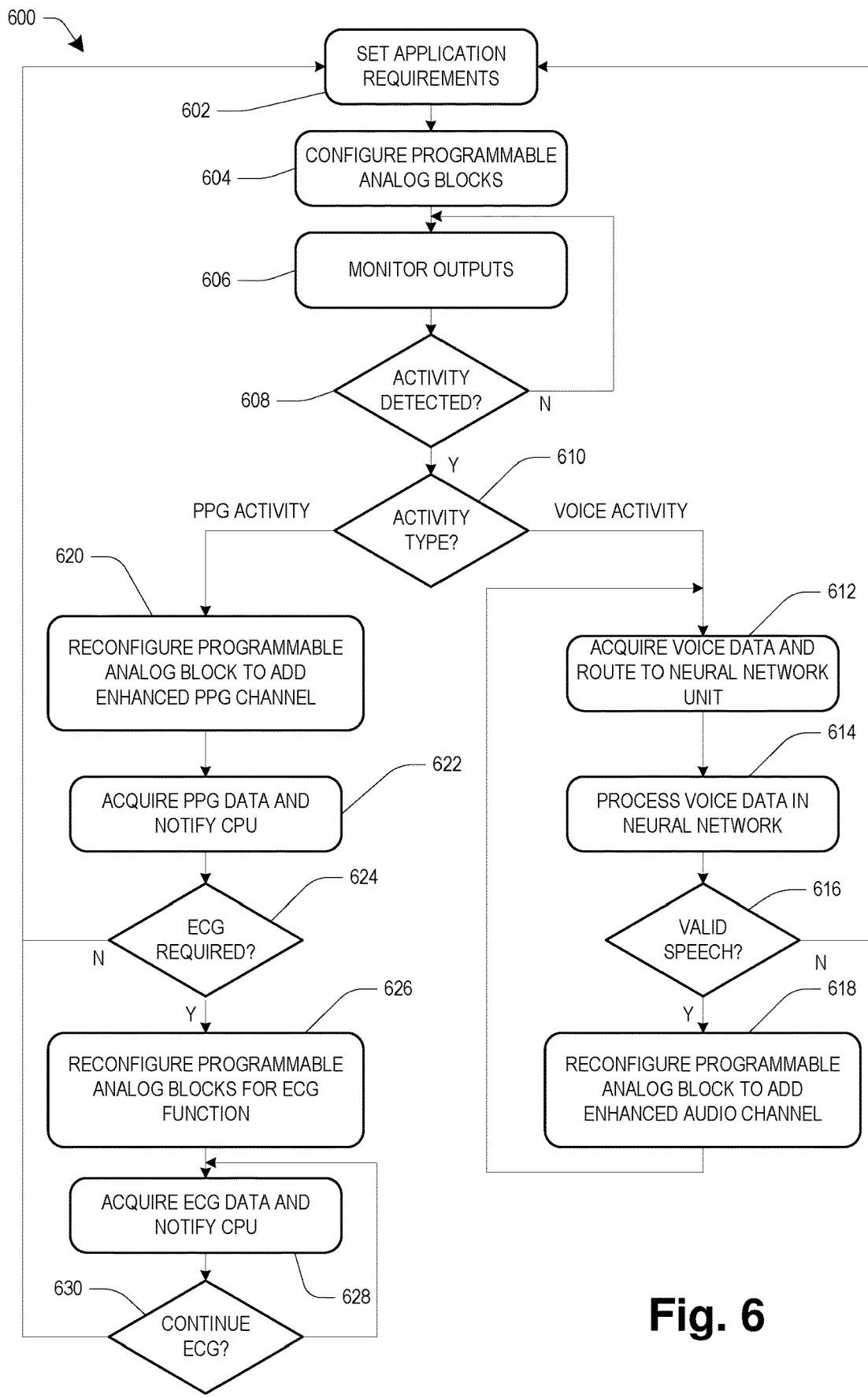
FIG. 6 is a flow chart illustrating an example method for configuring a programmable analog block, in accordance with some embodiments.

FIG. 6 is a flow chart illustrating an example method 600 for configuring a programmable analog block, in accordance with some embodiments. The method 600 may be performed by the AOAC 108. At 602, the application requirements are set, for example, by a vendor of a device including the system 100, a user, or a default configuration. In one example, the initial configuration includes a PPG channel to measure heart rate variability and a voice channel to detect the presence of speech. At 604, the AOAC 108 configures the programmable analog blocks 106 to support the application requirements. For example, the AOAC 108 may configure the programmable analog blocks 106 to provide the circuit 300 shown in FIGS. 3A and 3B for the PPG functionality and the top channel shown in FIG. 4A for the voice detection.

At 606, the AOAC 108 monitors the outputs of the PASS 102. At 607, the AOAC 108 determines if activity is detected based on the monitoring at 604. If no activity is detected at 608, the AOAC 108 continues monitoring at 604. If activity is detected at 608, the AOAC 108 determines the type of activity at 610. If the activity is voice activity at 610, the AOAC 108 acquires voice data and routes the voice data to the neural network unit 133. The neural network unit 133 processes the voice data at 614. If the neural network unit 133 does not identify valid speech at 616, the AOAC 108 returns to set the initial application requirements at 602. If the neural network unit 133 does identify valid speech at 616, the AOAC 108 reconfigures the programmable analog blocks 106 at 618 to provide an enhanced audio channel, for example, as illustrated in FIGS. 4A and 4B. The AOAC 108 returns to 612 to acquire additional voice data for processing by the CPU 132.

If the activity is PPG activity at 610, the AOAC 108 reconfigures the programmable analog blocks 106 at 620 to provide enhanced PPG processing, for example by adding another PPG channel. At 622, the AOAC 108 acquires PPG data and sends the data to the CPU 132. At 624, the CPU 132 executes a software application to determine if the PPG data suggests that an ECG should be conducted. If no ECG is required at 624, the AOAC 108 returns to set the initial application requirements at 602. If an ECG is required at 624, the AOAC 108 configures the programmable analog blocks 106 to support ECG functionality, for example, as illustrated in FIG. 5. If sufficient resources are not available, PPG and voice monitoring may be unavailable during ECG activities. At 628, the AOAC 108 acquires ECG data and notifies the CPU 132. The CPU 132 runs a software application to analyze the ECG data and determines whether the ECG should be continued at 630. If the CPU 132 determines that ECG activity should be terminated at 630, the AOAC 108 returns to set the initial application requirements at 602. If the CPU 132 determines that ECG activity should be continued at 630, the AOAC 108 collects additional ECG data at 628 for further analysis by the CPU 132.

The PASS 102 facilitates low power analog processing without CPU intervention. Activity may be detected and the functionality of the programmable analog blocks 106 may be reconfigured dynamically based on data processed by the PASS 102. This AOAC 108 performs this reconfiguration without waking or interrupting the CPU 132, thereby increasing power and processing efficiency.

Figure 7:
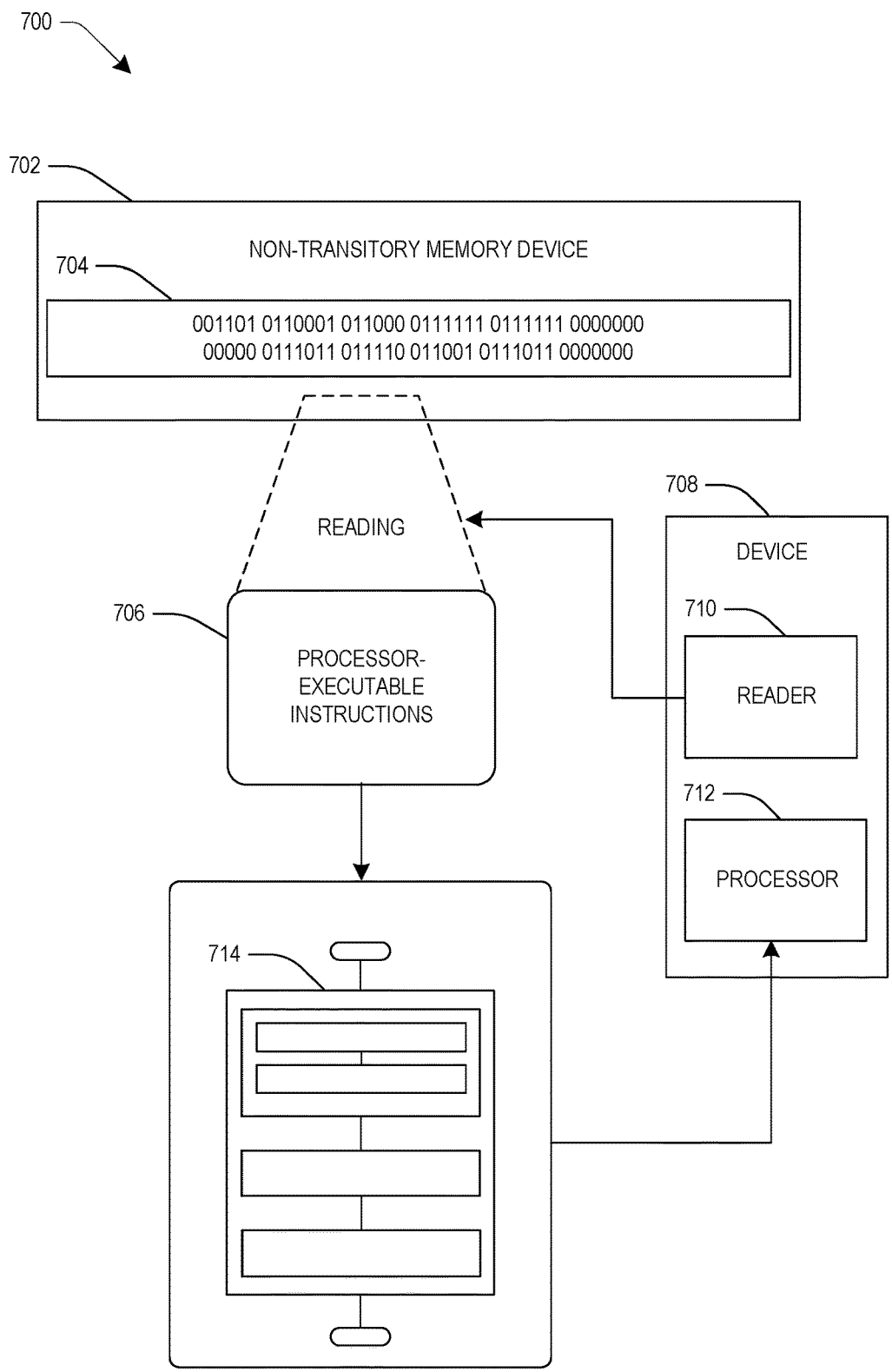
FIG. 7 illustrates an exemplary embodiment of a computer-readable medium, in accordance with some embodiments.

FIG. 7 illustrates an exemplary embodiment 700 of a computer-readable medium 702, in accordance with some embodiments. One or more embodiments involve a computer-readable medium comprising processor-executable instructions configured to implement one or more of the techniques presented herein. The embodiment 700 comprises a non-transitory computer-readable medium 702 (e.g., a CD-R, DVD-R, flash drive, a platter of a hard disk drive, etc.), on which is encoded computer-readable data 704. This computer-readable data 704 in turn comprises a set of processor-executable computer instructions 706 that, when executed by a computing device 708 including a reader 710 for reading the processor-executable computer instructions 706 and a processor 712 for executing the processor-executable computer instructions 706, are configured to facilitate operations according to one or more of the principles set forth herein. In some embodiments, the processor-executable computer instructions 706, when executed, are configured to facilitate performance of a method 714, such as at least some of the aforementioned method(s). In some embodiments, the processor-executable computer instructions 706, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

In an embodiment of the techniques presented herein, a system is provided. The system comprises a central processing unit, and a programmable analog sub-system connected to the central processing unit and comprising a first input terminal, a first programmable analog block configured according to a first configuration, and a controller configured to reconfigure the first programmable analog block according to a second configuration different than the first configuration based on a first signal received at the first input terminal independent from the central processing unit.

In an embodiment of the techniques presented herein, the central processing unit and the programmable analog block are on a single semiconductor die.

In an embodiment of the techniques presented herein, the system comprises a second input terminal, wherein the programmable analog block comprises a first operational amplifier, and routing circuitry selectively connecting the first input terminal or the second input terminal to a first terminal of the first operational amplifier.

In an embodiment of the techniques presented herein, the routing circuitry is configured to selectively connect one of a first reference signal or a second reference signal to a second terminal of the first operational amplifier.

In an embodiment of the techniques presented herein, in the first configuration, the first input terminal is connected by the routing circuitry to the first terminal of the first operational amplifier, and in the second configuration, the second input terminal is connected by the routing circuitry to the first terminal of the first operational amplifier.

In an embodiment of the techniques presented herein, the first input terminal is connected to a photodiode, and the second input terminal is connected to a microphone.

In an embodiment of the techniques presented herein, the first input terminal is connected to one of a photodiode or a microphone, and the second input terminal is connected to an electrocardiogram sensor.

In an embodiment of the techniques presented herein, in the first configuration, the first programmable analog block is configured to receive the first signal at the first terminal of the first operational amplifier and generate an output signal, and the controller is configured to reconfigure the first programmable analog block according to the second configuration based on the output signal.

In an embodiment of the techniques presented herein, the system comprises a second programmable analog block configured according to a third configuration, wherein in the third configuration, the second programmable analog block is configured to receive the first signal and generate an output signal, and the controller is configured to reconfigure the first programmable analog block according to the second configuration based on the output signal.

In an embodiment of the techniques presented herein, the controller is configured to reconfigure the second programmable analog block according to a fourth configuration different than the third configuration based on the first signal.

In an embodiment of the techniques presented herein, a programmable analog subsystem is provided. The programmable analog subsystem comprises a first operational amplifier, first routing circuitry configured to connect the first operational amplifier to a first input terminal in a first configuration and to connect the first operational amplifier to a second input terminal in a second configuration, second routing circuitry configured to connect one of a first reference signal or a second reference signal to the first operational amplifier in the first configuration or the second configuration, and a controller configured to receive an output signal of the first operational amplifier in the first configuration and reconfigure the first routing circuitry or the second routing circuitry based on the output signal.

In an embodiment of the techniques presented herein, the programmable analog subsystem comprises a second operational amplifier, and a switch connecting the first operational amplifier to the second operational amplifier.

In an embodiment of the techniques presented herein, the programmable analog subsystem comprises a programmable resistor connected to the first operational amplifier, and third routing circuitry configured to connect one of a first reference signal, a second reference signal, or an output of a second programmable analog block to the programmable resistor.

In an embodiment of the techniques presented herein, the programmable analog subsystem comprises a first resistor, a second resistor connected to the first resistor at a node, and a switch connected between the node and the first operational amplifier.

In an embodiment of the techniques presented herein, the programmable analog subsystem comprises a switch connected between an output of the first operational amplifier and an output terminal.

In an embodiment of the techniques presented herein, a method comprises configuring a first programmable analog block according to a first configuration, configuring a second programmable analog block according to a second configuration, receiving a first input signal at the first programmable analog block, generating a first output signal based on the first input signal received at the first programmable analog block, and reconfiguring one of the first programmable analog block or the second programmable analog block according to a third configuration based on the first output signal without intervention from an external central processing unit.

In an embodiment of the techniques presented herein, reconfiguring one of the first programmable analog block or the second programmable analog block according to the third configuration comprises reconfiguring the first programmable analog block to receive a second input signal, and generating a second output signal based on the second input signal received at the first programmable analog block.

In an embodiment of the techniques presented herein, the method comprises receiving a second input signal at the second programmable analog block, and generating a second output signal based on the second input signal received at the second programmable analog block, wherein reconfiguring one of the first programmable analog block or the second programmable analog block according to the third configuration comprises reconfiguring the second programmable analog block to receive a third input signal, and generating a third output signal based on the third input signal received at the second programmable analog block.

In an embodiment of the techniques presented herein, receiving the first input signal comprises receiving a first audio signal, receiving the second input signal comprises receiving an optical signal, and receiving the third input signal comprises receiving a second audio signal.

In an embodiment of the techniques presented herein, receiving the first input signal comprises receiving a first optical signal, generating the first output signal comprises generating a heart rate signal, and reconfiguring one of the first programmable analog block or the second programmable analog block comprises reconfiguring the first programmable analog block or the second programmable analog block to process an electrocardiogram signal.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A system, comprising:
a central processing unit; and
a programmable analog sub-system connected to the central processing unit and comprising:
a first input terminal;
a first programmable analog block configured according to a first configuration; and
a controller configured to reconfigure the first programmable analog block according to a second configuration different than the first configuration based on a first signal received at the first input terminal independent from the central processing unit.

2. The system of claim 1, wherein:
the central processing unit and the programmable analog block are on a single semiconductor die.

3. The system of claim 1, comprising:
a second input terminal, wherein:
the programmable analog block comprises:
a first operational amplifier; and
routing circuitry selectively connecting the first input terminal or the second input terminal to a first terminal of the first operational amplifier.

4. The system of claim 3, wherein:
the routing circuitry is configured to selectively connect one of a first reference signal or a second reference signal to a second terminal of the first operational amplifier.

5. The system of claim 3, wherein:
in the first configuration, the first input terminal is connected by the routing circuitry to the first terminal of the first operational amplifier; and
in the second configuration, the second input terminal is connected by the routing circuitry to the first terminal of the first operational amplifier.

6. The system of claim 5, wherein:
the first input terminal is connected to a photodiode; and
the second input terminal is connected to a microphone.

7. The system of claim 5, wherein:
the first input terminal is connected to one of a photodiode or a microphone; and
the second input terminal is connected to an electrocardiogram sensor.

8. The system of claim 2, wherein:
in the first configuration, the first programmable analog block is configured to receive the first signal at the first terminal of the first operational amplifier and generate an output signal; and
the controller is configured to reconfigure the first programmable analog block according to the second configuration based on the output signal.

9. The system of claim 1, comprising:
a second programmable analog block configured according to a third configuration, wherein:
in the third configuration, the second programmable analog block is configured to receive the first signal and generate an output signal; and
the controller is configured to reconfigure the first programmable analog block according to the second configuration based on the output signal.

10. The system of claim 9, wherein:
the controller is configured to reconfigure the second programmable analog block according to a fourth configuration different than the third configuration based on the first signal.

11. A programmable analog subsystem, comprising:
a first operational amplifier;
first routing circuitry configured to connect the first operational amplifier to a first input terminal in a first configuration and to connect the first operational amplifier to a second input terminal in a second configuration;
second routing circuitry configured to connect one of a first reference signal or a second reference signal to the first operational amplifier in the first configuration or the second configuration; and
a controller configured to receive an output signal of the first operational amplifier in the first configuration and reconfigure the first routing circuitry or the second routing circuitry based on the output signal.

12. The programmable analog subsystem of claim 11, comprising:
a second operational amplifier; and
a switch connecting the first operational amplifier to the second operational amplifier.

13. The programmable analog subsystem of claim 11, comprising:
a programmable resistor connected to the first operational amplifier; and
third routing circuitry configured to connect one of a first reference signal, a second reference signal, or an output of a second programmable analog block to the programmable resistor.

14. The programmable analog subsystem of claim 13, wherein the programmable resistor comprises:
a first resistor;
a second resistor connected to the first resistor at a node; and
a switch connected between the node and the first operational amplifier.

15. The programmable analog subsystem of claim 11, comprising:
a switch connected between an output of the first operational amplifier and an output terminal.

16. A method, comprising:
configuring a first programmable analog block according to a first configuration;
configuring a second programmable analog block according to a second configuration;
receiving a first input signal at the first programmable analog block;
generating a first output signal based on the first input signal received at the first programmable analog block; and
reconfiguring one of the first programmable analog block or the second programmable analog block according to a third configuration based on the first output signal without intervention from an external central processing unit.

17. The method of claim 16, wherein reconfiguring one of the first programmable analog block or the second programmable analog block according to the third configuration comprises:
reconfiguring the first programmable analog block to receive a second input signal; and
generating a second output signal based on the second input signal received at the first programmable analog block.

18. The method of claim 16, comprising:
receiving a second input signal at the second programmable analog block; and
generating a second output signal based on the second input signal received at the second programmable analog block, wherein:
reconfiguring one of the first programmable analog block or the second programmable analog block according to the third configuration comprises:
reconfiguring the second programmable analog block to receive a third input signal; and
generating a third output signal based on the third input signal received at the second programmable analog block.

19. The method of claim 18, wherein:
receiving the first input signal comprises receiving a first audio signal;
receiving the second input signal comprises receiving an optical signal; and
receiving the third input signal comprises receiving a second audio signal.

20. The method of claim 16, wherein:
receiving the first input signal comprises receiving a first optical signal;
generating the first output signal comprises generating a heart rate signal; and
reconfiguring one of the first programmable analog block or the second programmable analog block comprises reconfiguring the first programmable analog block or the second programmable analog block to process an electrocardiogram signal.

\* \* \* \* \*